US008749993B2

(12) United States Patent
Hoshino

(10) Patent No.: US 8,749,993 B2
(45) Date of Patent: Jun. 10, 2014

(54) ELECTRONIC DEVICE

(75) Inventor: Tsutomu Hoshino, Otsuki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 307 days.

(21) Appl. No.: 13/329,007

(22) Filed: Dec. 16, 2011

(65) Prior Publication Data

US 2012/0307427 A1    Dec. 6, 2012

(30) Foreign Application Priority Data

May 31, 2011    (JP) ................................. 2011-122415

(51) Int. Cl.
*H02B 1/01* (2006.01)
*G06F 1/16* (2006.01)
*H05K 7/14* (2006.01)

(52) U.S. Cl.
CPC ..................................... *H05K 7/1492* (2013.01)
USPC .. 361/825; 361/679.41; 361/797; 361/679.01

(58) Field of Classification Search
CPC ... G06F 1/1611; H05K 5/0247; H05K 7/1492
USPC .......................... 361/797, 807, 825, 829, 724; 361/679.24–679.25, 679.41–679.44, 361/679.01; 248/74.3, 229.17, 230.1, 248/230.8, 505; 211/26, 26.2
See application file for complete search history.

(56) References Cited

U.S. PATENT DOCUMENTS

| | | | | |
|---|---|---|---|---|
| 4,478,464 A * | 10/1984 | Williams | ...................... | 312/9.48 |
| 4,766,517 A * | 8/1988 | Abell | ............................. | 361/691 |
| 5,248,193 A * | 9/1993 | Schlemmer | ................ | 312/223.2 |
| 6,172,870 B1 * | 1/2001 | Novotny | ................... | 361/679.37 |
| 6,202,570 B1 * | 3/2001 | Kurtsman | ..................... | 108/108 |
| 6,202,966 B1 * | 3/2001 | MacDonald et al. | ......... | 248/243 |
| 6,219,228 B1 * | 4/2001 | Sun | .......................... | 361/679.21 |
| 6,259,604 B1 * | 7/2001 | Kuster | .......................... | 361/725 |
| 6,318,823 B1 * | 11/2001 | Liao | ............................. | 312/223.2 |
| 6,377,449 B1 * | 4/2002 | Liao et al. | ................. | 361/679.33 |
| 6,392,149 B1 * | 5/2002 | Kim et al. | ................... | 174/72 A |
| 6,498,732 B2 * | 12/2002 | Sucharczuk et al. | .......... | 361/796 |
| 6,597,576 B1 * | 7/2003 | Smith et al. | ................... | 361/724 |
| 6,600,656 B1 * | 7/2003 | Mori et al. | .................... | 361/724 |

(Continued)

FOREIGN PATENT DOCUMENTS

| | | |
|---|---|---|
| JP | H 05167276 | 7/1993 |
| JP | 06-23294 | 3/1994 |

(Continued)

OTHER PUBLICATIONS

Japanese Patent Application No. 2011-122415, First Office Action, mailed May 15, 2012, (with English Translation).

*Primary Examiner* — Adrian S Wilson
*Assistant Examiner* — Abhishek Rathod
(74) *Attorney, Agent, or Firm* — Blakely, Sokoloff, Taylor & Zafman LLP

(57) ABSTRACT

According to one embodiment, an electronic device of the embodiment includes a pair of racks, a box-shaped main body having a front face, a first side face which intersects with the front face, and a second side face which is opposed to the first side face, a first fixing portion which is fixed to the first side face and also to one of the racks, a second fixing portion which is fixed to the second side face and also to the other one of the racks, and a module which is mounted in the first fixing portion.

8 Claims, 6 Drawing Sheets

(56) References Cited

U.S. PATENT DOCUMENTS

| | | | |
|---|---|---|---|
| 6,600,665 B2* | 7/2003 | Lauchner | 361/826 |
| 7,097,047 B2* | 8/2006 | Lee et al. | 211/26.2 |
| 7,787,260 B2* | 8/2010 | Hruby et al. | 361/827 |
| 7,916,502 B2* | 3/2011 | Papakos et al. | 361/826 |
| 7,995,357 B2* | 8/2011 | Hruby et al. | 361/826 |
| 8,054,649 B2* | 11/2011 | Peng | 361/825 |
| 8,077,467 B2* | 12/2011 | Chen et al. | 361/726 |
| 8,339,781 B2* | 12/2012 | Zhang | 361/679.39 |
| 8,439,320 B2* | 5/2013 | Huang et al. | 248/221.11 |
| 8,472,198 B2* | 6/2013 | Peng et al. | 361/724 |
| 8,520,408 B2* | 8/2013 | Hruby et al. | 361/827 |
| 2003/0081379 A1* | 5/2003 | Chen | 361/685 |
| 2004/0120106 A1* | 6/2004 | Searby et al. | 361/683 |
| 2004/0165357 A1* | 8/2004 | Schneeberger | 361/724 |
| 2005/0201073 A1* | 9/2005 | Pincu et al. | 361/797 |
| 2007/0227770 A1* | 10/2007 | Chang | 174/481 |
| 2008/0174946 A1* | 7/2008 | Chen et al. | 361/683 |
| 2009/0073645 A1* | 3/2009 | Tsai et al. | 361/679.6 |
| 2011/0180497 A1* | 7/2011 | Zhang | 211/26 |
| 2011/0253647 A1* | 10/2011 | Yu et al. | 211/26 |
| 2011/0289521 A1* | 11/2011 | Chen | 720/601 |

FOREIGN PATENT DOCUMENTS

| | | |
|---|---|---|
| JP | 2000174449 | 6/2000 |
| JP | 2003-090183 | 3/2003 |
| JP | 2003-264385 | 9/2003 |
| JP | 2005026266 | 1/2005 |
| JP | 2008-152121 | 7/2008 |

* cited by examiner

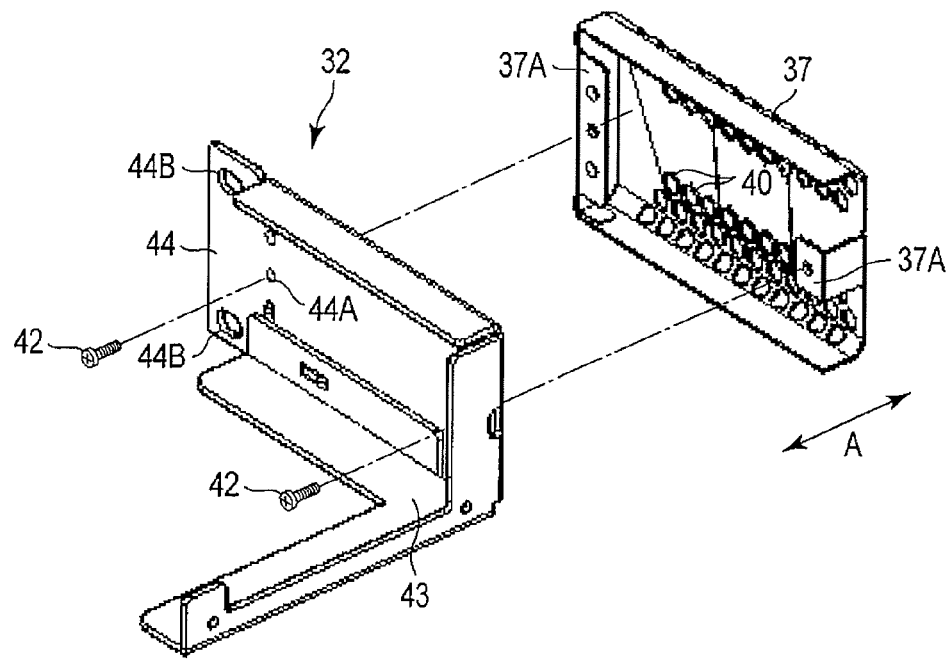
F I G. 9
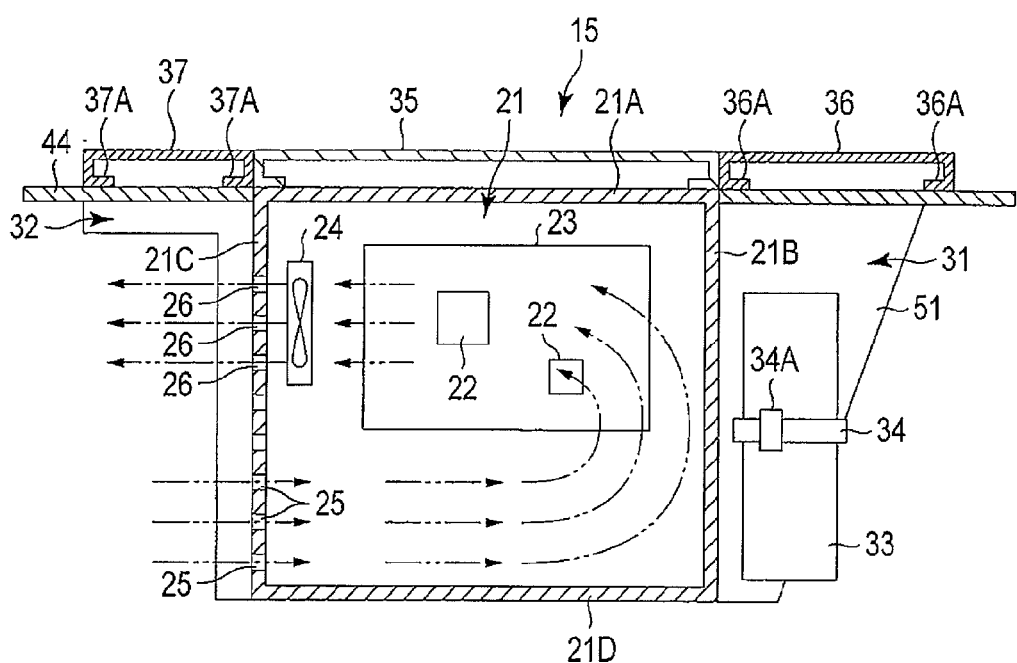
F I G. 10

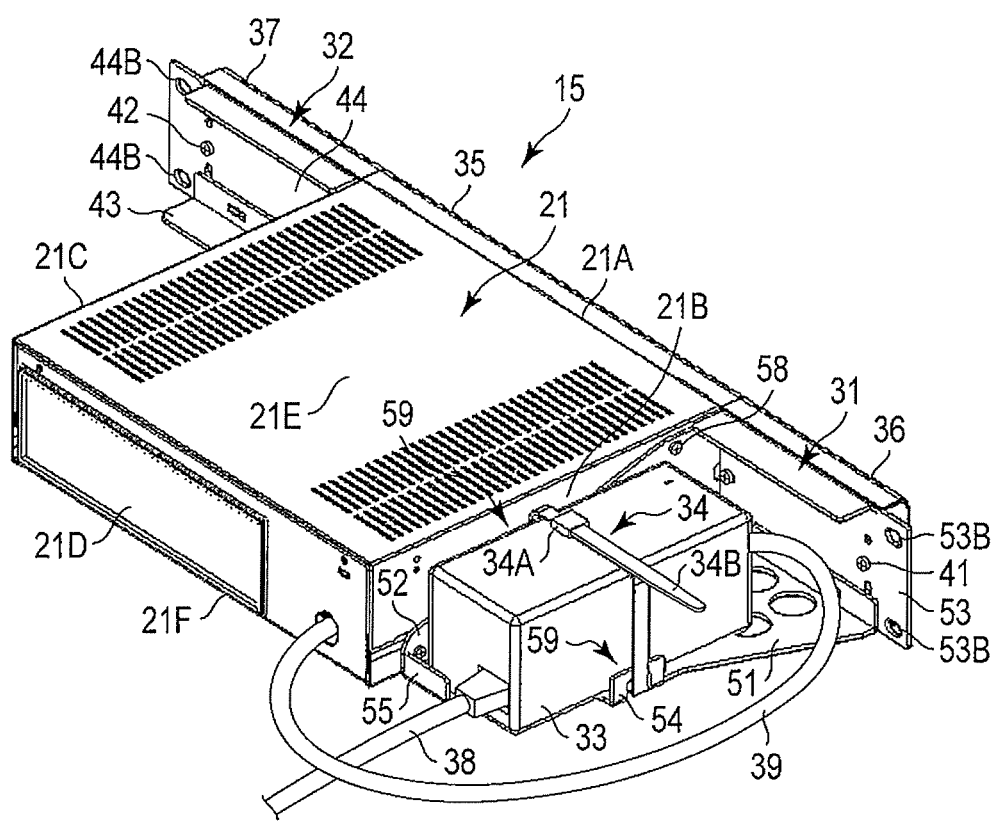
F I G. 11

ELECTRONIC DEVICE

CROSS-REFERENCE TO RELATED APPLICATIONS

This application is based upon and claims the benefit of priority from prior Japanese Patent Application No. 2011-122415, filed May 31, 2011, the entire contents of which are incorporated herein by reference.

FIELD

Embodiments described herein relate generally to an electronic device including a fixing portion to be arranged on a rack.

BACKGROUND

A container box (rack) in which an electronic device can be mounted is known. A plurality of servers and fire walls are provided for the container box (rack).

On the other hand, electronic devices have a tendency to be downsized, for example, and there has been a need to secure compatibility and versatility with the existing rack.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 9 is an exemplary exploded perspective view showing the second fixing portion of the second server shown in FIG. 3;

FIG. 10 is an exemplary sectional view taken in a horizontal direction and showing an internal structure of the main body of the second server shown in FIG. 3; and FIG. 11 is an exemplary perspective view showing a second server of a complex server, which is an example of an electronic device according to a second embodiment.

DETAILED DESCRIPTION

Various embodiments will be described hereinafter with reference to the accompanying drawings.

In general, according to one embodiment, an electronic device includes a pair of racks, a box-shaped main body having a front face, a first side face which intersects with the front face, and a second side face which is opposed to the first side face, a first fixing portion which is fixed to the first side face and also to one of the racks, a second fixing portion which is fixed to the second side face and also to the other one of the racks, and a module which is mounted in the first fixing portion.

Figure 1:
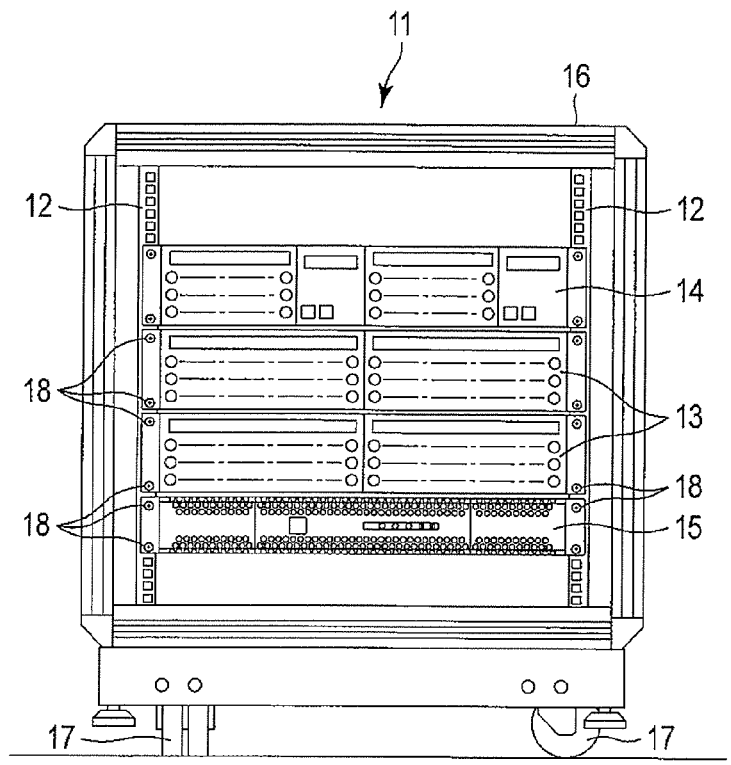
FIG. 1 is an exemplary front view showing a complex server, which is an example of an electronic device according to a first embodiment.

An embodiment of an electronic device will now be described with reference to FIGS. 1 to 10. As shown in FIG. 1, the electronic device according to the present embodiment is a complex server 11 including a plurality of servers, and has a substantially rectangular appearance. As shown in FIG. 1, the complex server 11 comprises a pair of (right and left) racks (struts) 12, two rack-mount first servers (file servers) 13, a fire wall 14 which is fixed to extend between the racks 12, a second server 15 (information processing unit) which is fixed to extend between the racks 12, a case 16 which surrounds the above-described members, and a caster 17 which is arranged at the bottom of the case 16. The first servers 13, the fire wall 14, and the second server 15 are fixed to the racks 12 with screws 18. The racks 12 are generally referred to as 19-inch racks, and a distance between the racks 12 is 19 inches (approximately 480 mm), for example. Each of the racks 12 extends in a longitudinal direction.

Figure 2:
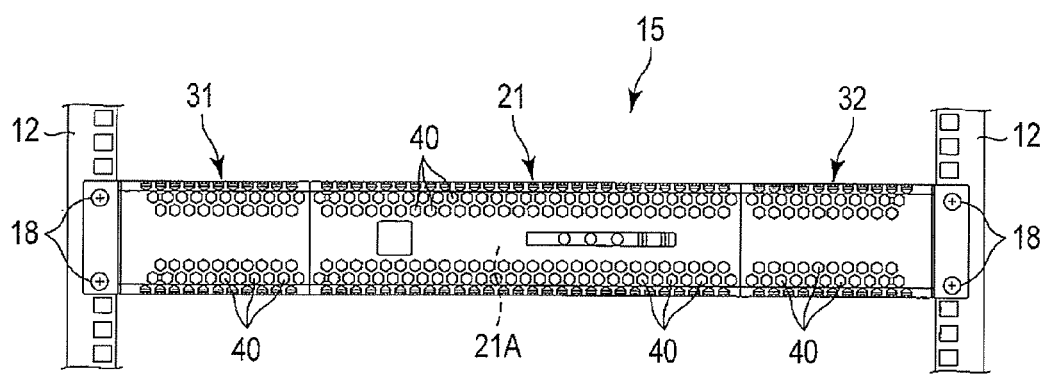
FIG. 2 is an exemplary front view showing a second server of the complex server shown in FIG. 1 in an enlarged scale.
Figure 3:
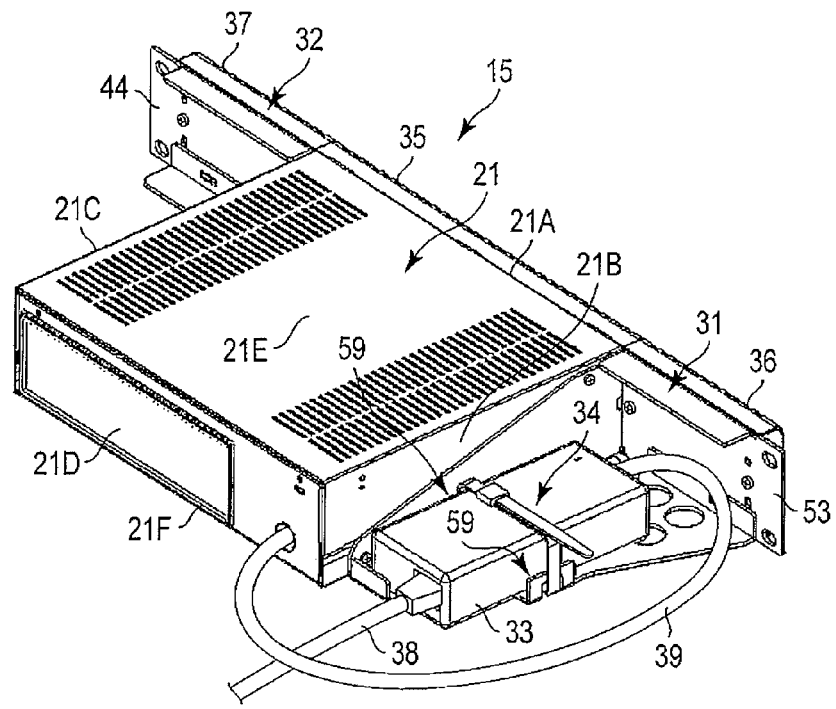
FIG. 3 is an exemplary perspective view showing what the second server shown in FIG. 2 looks like if viewed from a first fixing portion.

FIGS. 2 and 3 show details of the second server 15 (information processing unit). The second server 15 is a server for a specific purpose. More specifically, the second server 15 is the rack-mount server, and is an IP telephone server which is used in a small office, for example. The IP telephone server provides a telephone function which is required in a company for an IP telephone through a WAN and a LAN. By using a single IP telephone server, integration can be achieved in an environment in which a plurality of PBXs (Private Branch Exchange) must be used. Further, other than audio data, data which is transmitted and received by a TV phone, for example, can be managed by the IP telephone server. Furthermore, the server for the specific purpose, such as the IP telephone server, mainly reads data which is stored in the server, but may sometimes write data in the server. The second server 15 (information processing unit) may be a personal computer or a file server, etc., for private use, other than the server for the specific purpose.

The second server 15 comprises a square box-shaped main body 21 (housing), and the main body 21 (housing) is positioned between the racks 12. That is, as shown in FIGS. 2 and 3, in the present embodiment, a width dimension of the main body 21 is smaller than a dimension between the racks 12. The main body 21 includes a front face 21A, a first side face 21B which intersects with the front face 21A and is continuous with the front face 21A, a second side face 21C which intersects with the front face 21A and is continuous with the front face 21A, a back face 21D which is opposed to the front face 21A, and a top face 21E and a bottom face 21F which intersect with the front face 21A and are continuous with the front face 21A. The second side face 21C is opposed to the first side face 21B.

As shown in FIG. 10, the main body 21 comprises, in its interior, a printed circuit board 23 on which a plurality of circuit components 22, such as a CPU, are mounted, a fan 24 for cooling the plurality of circuit components 22, and other components (hard disk drive, etc.). The fan 24 is arranged longitudinally, and is set such that the axis of rotation of the fan 24 is provided in a lateral direction (horizontal direction). The second side face 21C of the main body 21 comprises an inlet 25 for taking in cooled air inside, and an outlet 26 for discharging exhaust air from the fan 24 to the outside. As will be described later, in the present embodiment, since a first fixing portion 31 on which a module 33 is mounted is fixed to the first side face 21B, the outlet 26 is not blocked by the module 33. Further, a distinction between the inlet 25 and the outlet 26 is made formally, and may be switched as appropriate depending on the actual flow of air.

Figure 4:
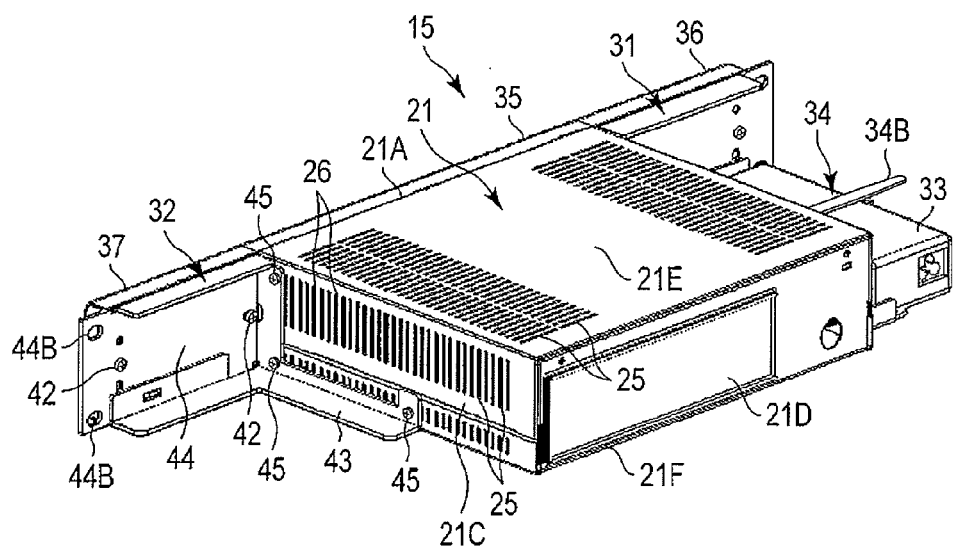
FIG. 4 is an exemplary perspective view showing what the second server shown in FIG. 2 looks like if viewed from a second fixing portion.

As shown in FIGS. 3 and 4, the second server 15 comprises the first fixing portion 31 (fixing tool) which is fixed to the first side face 21B of the main body 21, a second fixing portion 32 (fixing tool) which is fixed to the second side face 21C of the main body 21, the module 33 which is mounted (installed) on the first fixing portion 31, a band 34 which fixes the module 33 to the first fixing portion 31, a first decorative laminated sheet 35 which is fixed to the front face 21A of the main body 21, a second decorative laminated sheet 36 which is fixed to a first front wall 53 (front surface) of the first fixing portion 31, a third decorative laminated sheet 37 which is fixed to a second front wall 44 (front surface) of the second fixing portion 32, and a first cable 38 and a second cable 39 which are connected to the module 33.

Figure 5:
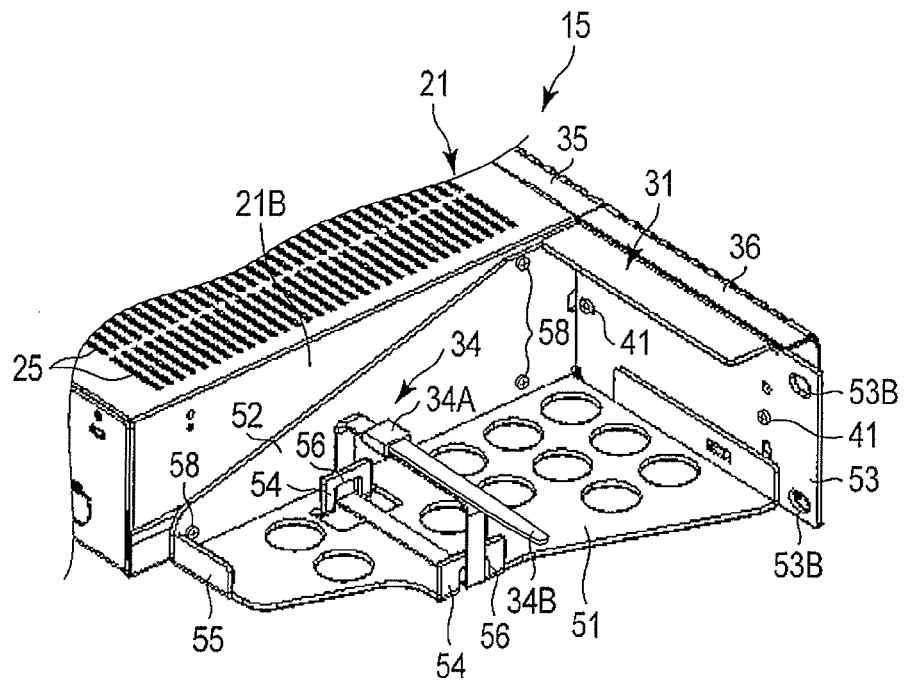
FIG. 5 is an exemplary perspective view showing the first fixing portion of the second server shown in FIG. 3 in a state where a module is removed in an enlarged scale.

In the present embodiment, the module 33 is composed of an alternating current/direct current conversion unit (AC/DC converter), the so-called AC adapter. As shown in FIG. 5, the band 34 comprises, for example, a ring-shaped portion 34A on one end and a distal end portion 34B on the other end, and is formed as an integral belt-like member with synthetic resin. By pulling the distal end portion 34B which is passed through the ring-shaped portion 34A, an amount of tightening of the module 33, which is located within the band 34, can be adjusted. As the band 34 is passed through an opening portion 56 of the first fixing portion 31, movement in a vertical direction of the module 33 (uplift) can be restricted. The first cable 38 is the so-called AC cable, and connects between an external power source (receptacle) and the module 33, thereby supplying the module 33 with alternating-current electricity. The second cable 39 is the so-called DC cable, and connects between the module 33 and the main body 21, thereby supplying the main body 21 with direct-current electricity.

Figure 8:
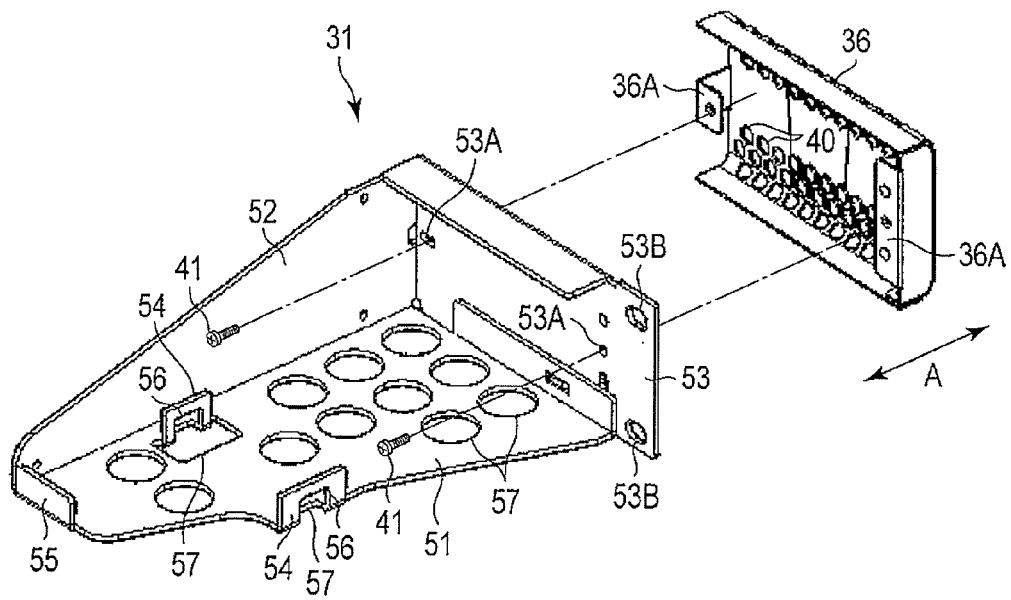
FIG. 8 is an exemplary exploded perspective view showing the first fixing portion shown in FIG. 6.

The first decorative laminated sheet 35, the second decorative laminated sheet 36, and the third decorative laminated sheet 37 are provided with a plurality of hexagonal holes 40, as shown in FIG. 2, and constitute a single continuous exterior. In other words, the first decorative laminated sheet 35, the second decorative laminated sheet 36, and the third decorative laminated sheet 37 constitute an exterior of unified design. As shown in FIGS. 8 and 9, the second decorative laminated sheet 36 and the third decorative laminated sheet 37 are formed by the same components. For example, by rotating the second decorative laminated sheet 36 by 180 degrees about axis A (as shown in FIG. 8), the second decorative laminated sheet 36 can be used as the third decorative laminated sheet 37. The first decorative laminated sheet 35 is fixed to the front face 21A of the main body 21 by welding, for example. As shown in FIG. 8, the second decorative laminated sheet 36 includes a second mounting portion 36A having a screw hole. The second decorative laminated sheet 36 is fixed to the first front wall 53 of the first fixing portion 31 by a first screw 41 which is passed through the screw hole. As shown in FIG. 9, the third decorative laminated sheet 37 includes a third mounting portion 37A having a screw hole. The third decorative laminated sheet 37 is fixed to the second front wall 44 of the second fixing portion 32 by a second screw 42 which is passed through the screw hole.

As shown in FIG. 3, the second fixing portion 32 constitutes a connection which couples the second side face 21C of the main body 21 to the rack 12. The second fixing portion 32 is fixed to one of the racks 12. As shown in FIG. 9, the second fixing portion 32 comprises an L-shaped support portion 43 (bracket), and the second front wall 44 (front surface) which is welded to the support portion 43. The second front wall 44 comprises a hole 44A through which the second screw 42 for fixing the third decorative laminated sheet 37 passes, and a screw portion 44B through which a screw 18 for fixing the second fixing portion 32 to the rack 12 passes. The second fixing portion 32 is fixed to the main body 21 by a second fixing member 45, such as a screw, which is passed through a screw hole provided on the support portion 43 (see FIG. 4).

Figure 6:
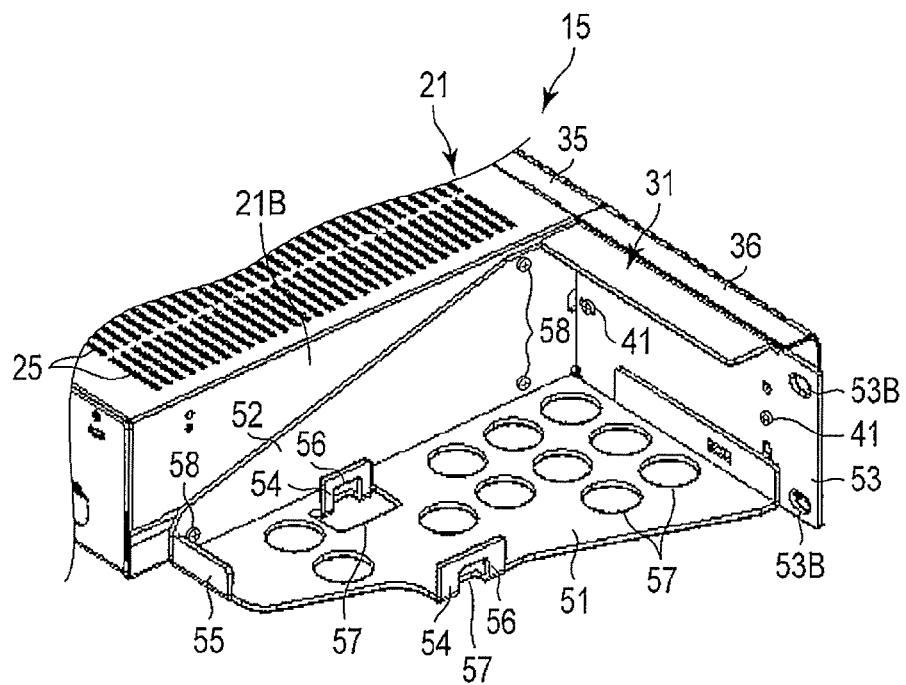
FIG. 6 is an exemplary perspective view showing the first fixing portion of the second server shown in FIG. 5 in a state where a band is removed in an enlarged scale.
Figure 7:
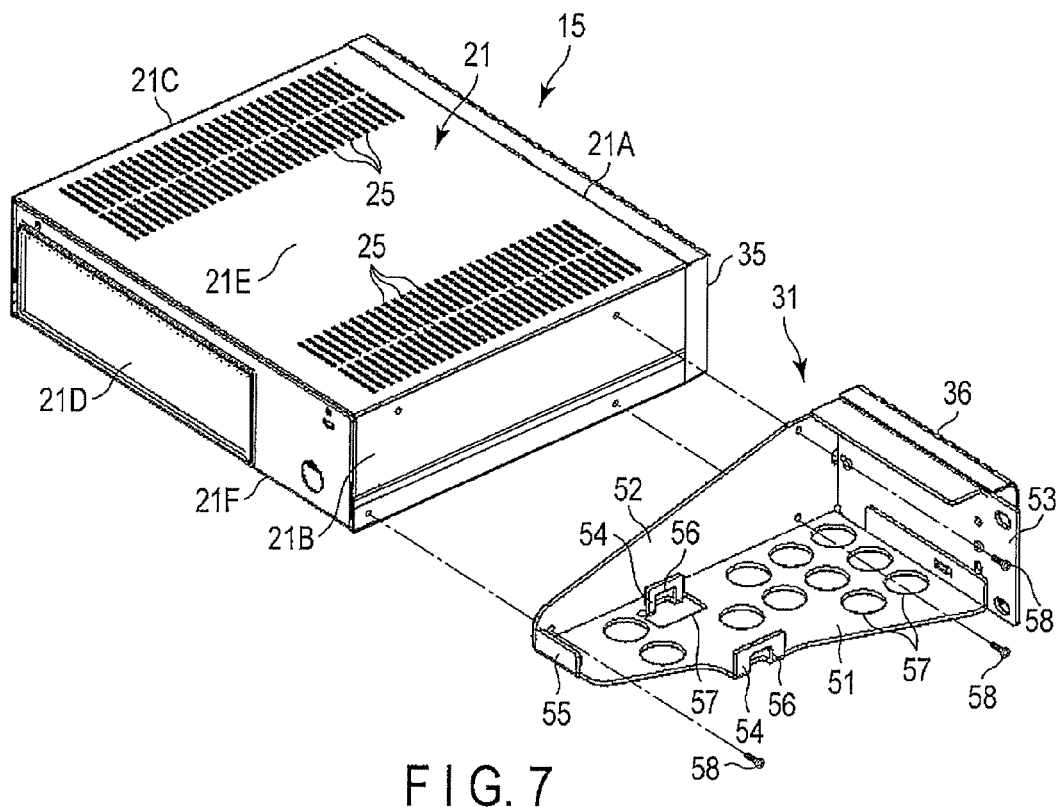
FIG. 7 is an exemplary exploded perspective view showing a main body of the second server and the first fixing portion shown in FIG. 6.

As shown in FIGS. 2 and 3, the first fixing portion 31 constitutes a connection which couples the first side face 21B of the main body 21 to the rack 12. The first fixing portion 31 is fixed to the other one of the racks 12. As shown in FIGS. 6 and 7, the first fixing portion 31 comprises a bottom wall 51 (bracket) which serves as a mounting surface of the module 33, a contact portion 52 which extends from the bottom wall 51 and directly comes into contact with the main body 21, the first front wall 53 (front surface) welded to the bottom wall 51, a pair of projection portions 54 which project from the bottom wall 51, a second projection portion 55 which projects from the bottom wall 51, an opening portion 56 which is provided in each of the projection portions 54, and a plurality of through-holes 57 provided on the bottom wall 51. The first front wall 53 comprises a hole 53A though which the first screw 41 for fixing the second decorative laminated sheet 36 passes, and a hole portion 53B through which the screw 18 for fixing the first fixing portion 31 to the rack 12 passes. The first fixing portion 31 is fixed to the main body 21 by a first fixing member 58, such as a screw which is passed through a screw hole provided on the contact portion 52 (see FIG. 7).

The pair of projection portions 54 extend in a direction which intersects the bottom wall 51. As shown in FIGS. 3 and 5, the pair of projection portions 54 hold the module 33 therebetween, and can restrict movement (displacement) in a width direction of the module 33. A slight gap 59 is secured between each of the projection portions 54 and the module 33.

The second projection portion 55 extends in a direction which intersects the projection portions 54, and can restrict the back-and-forth movement (displacement) of the module 33, for example. The bottom wall 51, the contact portion 52, the pair of projection portions 54, and the second projection portion 55 are formed by folding a metal plate.

Each opening portion 56 is formed to be continuous with one of the plurality of through-holes 57 provided on the bottom wall 51 (mounting surface) of the first fixing portion 31. In other words, one opening portion 56 is provided extending over each of the projection portions 54 and the bottom wall 51 (mounting surface). Therefore, the band 34 can be easily passed through the opening portion 56 while the module 33 is held on the bottom wall 51. Further, even if the band 34 is fastened tightly, since the band 34 at the bottom remains on the bottom wall 51, no uplift of the module 33 occurs.

The flow of the cooled air within the main body 21 (housing) will be described with reference to FIG. 10. The air (cooled air) taken in from the inlet 25 of the main body 21 circulates inside the main body 21, for example, to cool each of the circuit components 22 on the printed circuit board 23. Further, the air used for cooling is discharged outside the main body 21 (housing) through the outlet 26 by rotation of the fan 24. The intake and discharge of air as stated above is performed by driving the fan 24. In the present embodiment, since the first fixing portion 31 in which the module 33 is provided is not fixed to the second side face 21C, which is provided with the inlet 25 and the outlet 26, the intake and the discharge can be carried out smoothly.

According to the first embodiment, the electronic device comprises the pair of racks 12, the box-shaped main body 21 including the front face 21A, the first side face 21B which intersects with the front face 21A, and the second side face 21C which is opposed to the first side face 21B, the first fixing portion 31 which is fixed to the first side face 21B and also to the one of the racks 12, the second fixing portion 32 which is fixed to the second side face 21C and also to the other one of the racks 12, and the module 33 which is provided in the first fixing portion 31.

With this structure, even if the main body 21 does not agree with the dimensions of the racks 12, the main body 21 can be fixed to the racks 12. Thus, various forms of use can be adopted, such as using the main body 21 alone in a vertical position, or fixing the main body 21 to the racks 12 as in the present embodiment. In other words, versatility of the main body 21 can be remarkably improved. Further, the module 33 can be provided by using the first fixing portion 31. If the above structure is not adopted, the installation becomes unstable since the module 33 dangles from the main body 21 through a cable, for example, and the cable and the module 33 may easily drop off. The above-mentioned structure can resolve the problem of unstable and disordered (unorganized) installation. There is also a merit of being able to simplify the wiring by shortening a cable to connect between the main body 21 and the module 33.

The electronic device further comprises the pair of projection portions 54 which are provided in the first fixing portion 31 and configured to hold the module 33 therebetween, the opening portion 56 which is provided in each of the projection portions 54, and the band 34 which is passed through the opening portion 56 and fixes the module 33 to the first fixing portion 31. With this structure, the module 33 can be arranged stably by using the first fixing portion 31. Thus, the module 33 can be maintained more stably with the pair of projection portions 54, the opening portion 56, and the band 34.

The electronic device further comprises the plurality of through-holes 57 provided on the first fixing portion 31, and the opening portion 56 is continuous with one of the plurality of through-holes 57. With this structure, it is possible to improve the heat dissipation property of the module 33 by virtue of the plurality of through-holes 57 provided, and achieve the weight reduction of the electronic device as a whole. Further, since the opening portion 56 is continuous with one of the plurality of through-holes 57, the area of the opening portion 56 can be increased. Thus, the band 34 can be easily passed through the opening portion 56 while the module 33 is held on the first fixing portion 31. Further, the opening portion 56, when provided to extend over one of the projection portions 54 and the mounting surface (bottom wall 51), enables to prevent uplift of the module 33 because even if the band 34 is fastened tightly, the band 34 at the bottom remains on the bottom wall.

A gap 59 is provided between each of the projection portions 54 and the module 33. With this structure, it is possible to flexibly respond to a design change, etc., as the gap 59 is intentionally secured as stated above. In addition, various kinds of module 33 or module 33 having different purposes can be mounted.

The main body 21 includes the outlet 26 provided on the second side face 21C. With this structure, even if the module 33 is provided on first fixing potion 31, the module 33 does not obstruct the discharge of air, and the main body 21 can be cooled smoothly.

The electronic device further comprises the first decorative laminated sheet 35 which is fixed to the front side of the main body 21, the second decorative laminated sheet 36 which is fixed to the front side of the first fixing portion 31, and the third decorative laminated sheet 37 which is fixed to the front side of the second fixing portion 32, and the first decorative laminated sheet 35, the second decorative laminated sheet 36, and the third decorative laminated sheet 37 constitute a single continuous exterior. With this structure, a difference in size between the main body 21 and the racks 12 will not be recognized by a user, and the appearance of the electronic device can be enhanced. Further, since the third decorative laminated sheet 37 is the same as the second decorative laminated sheet 36 in form, the same component can be used for the second decorative laminated sheet 36 and the third decorative laminated sheet 37. Thus, it is possible to reduce the manufacturing cost as well as improve the quality of appearance.

A second embodiment of an electronic device will be described with reference to FIG. 11. A complex server 11, which is an example of the electronic device of the second embodiment, is different from the complex server 11 of the first embodiment in the form of a module 33. However, the other parts are in common with the parts of the first embodiment. Therefore, an explanation will be given mainly for the different parts, and an explanation will be omitted for the common parts by assigning the same reference numerals thereto. The complex server 11 of the second embodiment has the appearance similar to that shown in FIG. 1.

In the second embodiment, the module 33 is larger than the module 33 of the first embodiment. The module 33 is composed of an uninterruptible power supply (UPS), for example. The module 33 can store power in a built-in battery, and the power can be supplied to a main body 21 in the event of a power failure, for example, thereby maintaining the operation state of the main body 21 for a predetermined length of time. Further, the module 33 may be a battery itself. The module 33 may take the form of supplying the power to a first server 13 and fire wall 14 as well at the time of the power failure.

The electronic device is not limited to the above embodiments, and may be embodied by modifying constituent features without departing from the spirit when the electronic device is put into practice. That is, the module 33 is not limited to the above example of the UPS or an alternating current/direct current conversion unit. The module 33 can be any type of component as long as it can be connected to the main body 21 through a cable, etc., and has a certain size, such as an external hard disk drive (HDD), an external optical disk drive (ODD), and an antenna unit of a wireless LAN.

Various inventions can be achieved by suitably combining the constituent features disclosed in the above embodiments. For example, some constituent features may be deleted from the entire constituent features shown in the embodiments. Further, constituent features of different embodiments may be combined suitably.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
   a pair of racks;
   a box-shaped main body including a front face, a first side face which intersects with the front face, and a second side face which is opposed to the first side face;
   a first fixing portion which is fixed to the first side face and also to one of the racks;
   a second fixing portion which is fixed to the second side face and also to the other one of the racks; and
   a module which is mounted in the first fixing portion;
   a pair of projection portions which are provided at the first fixing portion and configured to hold the module therebetween;
   an opening portion which is provided in each of the projection portions; and
   a band which is passed through the opening portion and fixes the module to the first fixing portion.

2. The electronic device of claim 1, further comprising a plurality of through-holes provided on the first fixing portion, and wherein the opening portion is continuous with one of the plurality of through-holes.

3. The electronic device of claim 2, wherein a gap is provided between each of the projection portions and the module.

4. The electronic device of claim 3, wherein the main body includes an outlet provided on the second side face.

5. The electronic device of claim 4, further comprising:
   a first decorative laminated sheet fixed to the front face of the main body;
   a second decorative laminated sheet fixed to a front face of the first fixing portion; and
   a third decorative laminated sheet fixed to a front face of the second fixing portion,
   wherein the first decorative laminated sheet, the second decorative laminated sheet, and the third decorative laminated sheet constitute a single continuous exterior.

6. The electronic device of claim 5, wherein the third decorative laminated sheet is the same as the second decorative laminated sheet in form.

7. The electronic device of claim 1 further comprising:
   an outlet which is provided on the second side face.

8. An electronic device comprising:
   a pair of racks;
   a main body including a front face, a first side face which intersects with the front face, and a second side face which is opposed to the first side face;
   a first fixing portion which couples the first side face to one of the racks;
   a second fixing portion which couples the second side face to the other one of the racks;
   a module which is mounted on a mounting surface of the first fixing portion;
   a pair of projection portions which are provided at the first fixing portion and configured to hold the module therebetween;
   an opening portion which is provided extending over one of the projection portions and the mounting surface; and
   a band which is passed through the opening portion and fixes the module to the first fixing portion.

* * * * *